(12) United States Patent
Uchida

(10) Patent No.: US 9,328,711 B2
(45) Date of Patent: May 3, 2016

(54) CONTROL UNIT FOR VEHICLE

(71) Applicant: DENSO CORPORATION, Kariya, Aichi-pref. (JP)

(72) Inventor: Tetsuya Uchida, Nishio (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 723 days.

(21) Appl. No.: 13/658,271

(22) Filed: Oct. 23, 2012

(65) Prior Publication Data
US 2013/0106174 A1 May 2, 2013

(30) Foreign Application Priority Data
Oct. 31, 2011 (JP) .................................. 2011-238901

(51) Int. Cl.
*B60L 1/00* (2006.01)
*B60L 3/00* (2006.01)
(Continued)

(52) U.S. Cl.
CPC ........... *F02N 11/0866* (2013.01); *H01M 10/46* (2013.01); *F02N 11/0814* (2013.01); *F02N 11/108* (2013.01); *G01R 31/007* (2013.01); *H01M 10/44* (2013.01)

(58) Field of Classification Search
CPC Y02T 10/7005; Y02T 10/7077; H02K 11/00; H01M 10/44; H01M 10/46; B60R 16/03; B60R 16/0315
USPC ......... 307/9.1, 10.7, 65, 66, 10.1; 320/15, 30, 320/43, 12, 14, 19; 322/99; 169/61
See application file for complete search history.

(56) References Cited

U.S. PATENT DOCUMENTS 4,597,451 A * 7/1986 Moore ................. G08B 25/014
169/16
5,488,283 A * 1/1996 Dougherty .......... B60L 11/1855
307/10.1
(Continued)

FOREIGN PATENT DOCUMENTS

JP 11-280513 10/1999
JP 2003-148310 5/2003
(Continued)

OTHER PUBLICATIONS

Office action dated Feb. 25, 2014 in corresponding Japanese Application No. 2011-238901.
(Continued)

*Primary Examiner* — Jared Fureman
*Assistant Examiner* — Jagdeep Dhillon
(74) *Attorney, Agent, or Firm* — Harness, Dickey & Pierce, P.L.C.

(57) ABSTRACT

In a control unit for a vehicle, a redundancy circuit includes a main power source line, a back-up power source line, and a diode. The back-up power source line performs a voltage compensation operation when a voltage of the main power source line is lower than a predetermined voltage. The back-up power source line is turned on when a predetermined period of time has elapsed after the main power source line is turned on. The back-up power source line is turned off when a predetermined period of time has elapsed after the main power source line is turned off. The diode is disposed on the back-up power source line. The fault detector detects an open fault of the diode when a voltage of a cathode of the diode is lower than a predetermined threshold within the predetermined period of time after the main power source line is turned off.

4 Claims, 4 Drawing Sheets

(51) Int. Cl.
*H02G 3/00* (2006.01)
*F02N 11/08* (2006.01)
*H01M 10/46* (2006.01)
H01M 10/44 (2006.01)
F02N 11/10 (2006.01)
G01R 31/00 (2006.01)

(56) References Cited

U.S. PATENT DOCUMENTS

| | | | | |
|---|---|---|---|---|
| 5,717,310 | A | * | 2/1998 | Sakai ............... B60L 11/1862 307/10.1 |
| 6,053,842 | A | | 4/2000 | Kitada et al. |
| 2003/0042873 | A1 | | 3/2003 | Osada et al. |
| 2006/0097577 | A1 | | 5/2006 | Kato et al. |
| 2008/0079440 | A1 | * | 4/2008 | Lee ................... H05B 41/2855 324/537 |
| 2009/0146617 | A1 | * | 6/2009 | Yoshida ............. H02K 11/001 322/99 |

FOREIGN PATENT DOCUMENTS

| | | |
|---|---|---|
| JP | 2004-328988 | 11/2004 |
| JP | 2010-167997 | 8/2010 |
| JP | 2011-098593 | 5/2011 |
| WO | WO 2008/053808 | 5/2008 |

OTHER PUBLICATIONS

Office action dated Aug. 29, 2014 in corresponding Chinese Application No. 201210428796.1.

* cited by examiner

CONTROL UNIT FOR VEHICLE

CROSS REFERENCE TO RELATED APPLICATION

This application is based on Japanese Patent Application No. 2011-238901 filed on Oct. 31, 2011, the disclosure of which is incorporated herein by reference.

TECHNICAL FIELD

The present disclosure relates to a control unit for a vehicle, which includes two power source lines.

BACKGROUND

An idling stop system, which stops an engine when a vehicle is stationary and restarts the engine when a driver resumes driving, has been put into practice considering an environmental issue. When the engine is restarted, because a starting current of a starter motor is large, a voltage of a battery reduces. As a result, lightings and the like are darkened temporarily. Further, when the engine is restarted in an unfavorable condition, such as the battery is deteriorated or the vehicle is in a cold district, the voltage of the battery will be lower than a voltage to operate safety devices and in-vehicle electric devices, such as navigation system and audio. In such a case, these devices may be unintentionally reset.

In an electric device or a control unit coupled to a battery, it has been proposed to provide a back-up power source in addition to a main power source that is supplied with electric power from the battery in order to address the above matter. For example, JP2003-148310A, which corresponds to US2003/0042873A1, describes to charge a capacitor with electric power from a battery and to supply the electric power charged in the capacitor as a back-up power supply.

As another example, JP2004-328988A; which corresponds to US2006/0097577A1, describes to employ a back-up power source such as a lithium ion battery, in addition to a main power source such as a lead battery, and to charge both of the main power source and the back-up power source with electric power generated by a generator such as an alternator. In JP2004-328988A, a main power source line and a back-up power source line are separately connected to a safety electronic control unit (ECU), and electric power is supplied to the safety ECU through a diode in a redundancy manner. Moreover, the back-up power source line is turned on when a predetermined period of time has elapsed after the main power source line is turned on.

In a unit including two power source lines as described above, if a malfunction occurs in the back-up power source, the malfunction of the back-up power source is easily detected by a detection circuit provided in the back-up power source. However, a voltage of a line at a cathode side of the diode forming the redundancy circuit is common between the main power source line and the back-up power source line. Therefore, it is difficult to detect an open fault of the diode.

Specifically, when the diode of the back-up power source line has the open fault, the voltage at the cathode side of the diode is increased by the voltage of the main power source line. Therefore, it is difficult to detect the open fault of the diode of the back-up power source line.

In a state where the diode of the back-up power source line has the open fault, if the engine is restarted from an idling stop state, there is a possibility that the voltage of the unit may be insufficient due to the unfavorable condition. For example, with regard to an airbag control unit for controlling activation of airbags according to a collision, the open fault of the diode of the back-up power source line needs to be properly detected.

SUMMARY

It is an object of the present disclosure to provide a control unit for a vehicle, which is capable of detecting an open fault of a diode of a back-up power source line.

According to an aspect of the present disclosure, a control unit includes a redundancy circuit and a fault detector. The redundancy circuit includes a main power source line, a back-up power source line, and a diode. The main power source line is supplied with electric power from a battery. The back-up power source line performs a voltage compensation operation when a voltage of the main power source line is lower than a predetermined voltage. The back-up power source line is turned on when a predetermined period of time has elapsed after the main power source line is turned on. The back-up power source line is turned off when a predetermined period of time has elapsed after the main power source line is turned off. The diode is disposed on the back-up power source line. The fault detector monitors a voltage of a cathode of the diode, and detects an open fault of the diode when the voltage of the cathode of the diode is lower than a predetermined threshold within the predetermined period of time after the main power source line is turned off.

In the above structure, when the main power source line is turned off, that is, the electric power supply to the main power source line is stopped, in a normal condition, the voltage of the cathode of the diode is maintained by means of the voltage compensation operation of the back-up power source line. However, if the diode has an open fault, the voltage of the cathode of the diode largely drops. Therefore, the open fault of the diode can be detected based on the voltage of the cathode of the diode.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, an embodiment of the present disclosure will be described with reference to the drawings.

Figure 1:
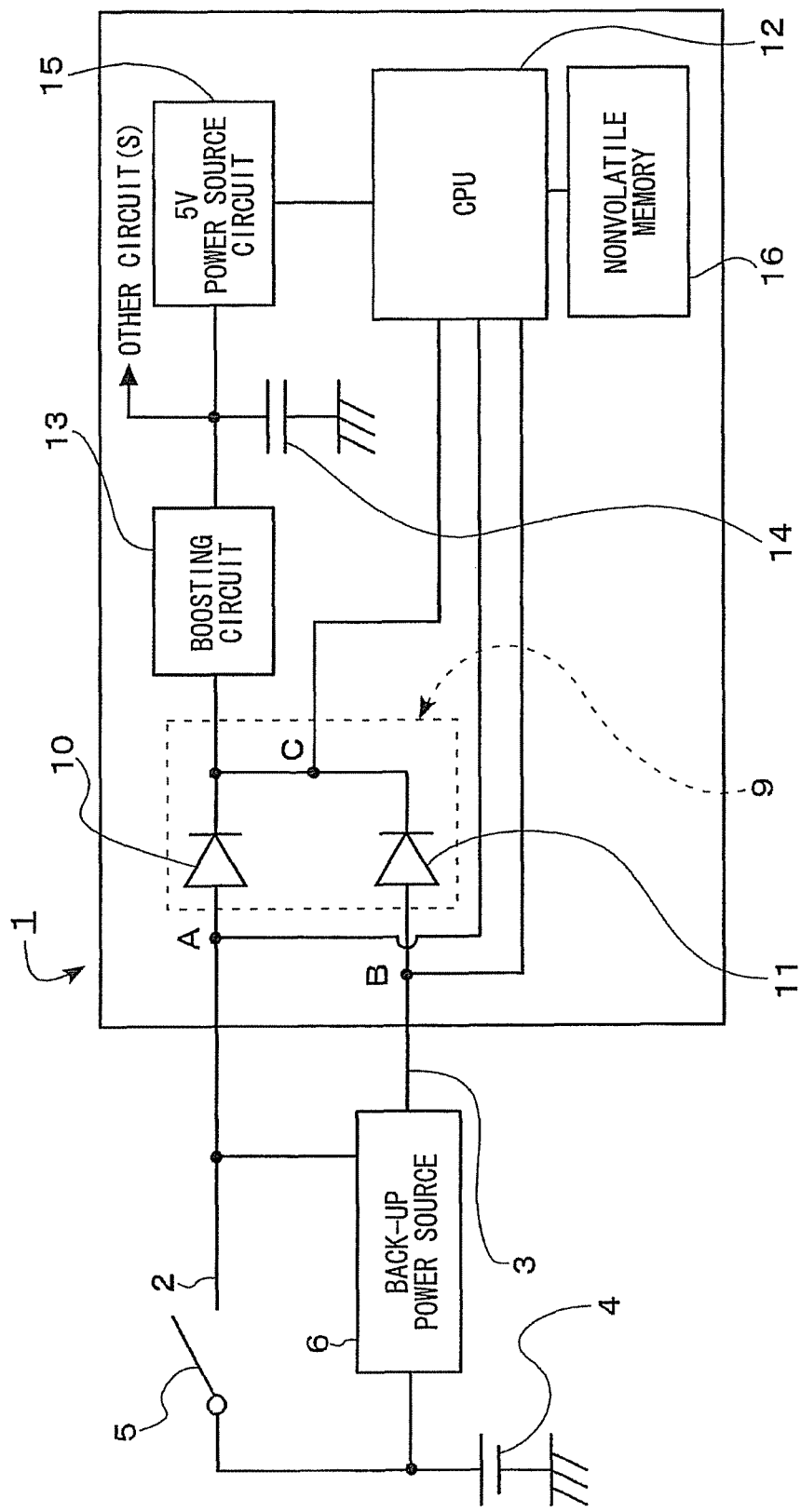
FIG. 1 is a circuit diagram of an airbag electronic control unit according to an embodiment of the present disclosure.

For example, a control unit according to the embodiment is employed as an airbag electronic control unit (ECU) 1 for controlling an operation of airbags, which are activated to protect passengers at a time of collision. As shown in FIG. 1, the airbag ECU 1 includes two power source lines, such as a main power source line 2 and a back-up power source line 3.

In FIG. 1, a battery 4 is a lead battery having a nominal output of 12V. The battery 4 is electrically coupled to and decoupled from the main power source line 2 by an ignition switch 5. The ignition switch 5 is controlled in accordance with a manual operation of an ignition key or a start button (hereinafter referred to as the key operation).

A back-up power source 6 is coupled to the back-up power source line 3. For example, the back-up power source 6 is activated by using electric power from the battery 4 as a power source. The back-up power source 6 is activated when a predetermined period of time has elapsed after the main power source line 2 is electrically coupled to the battery 4 by the ignition switch 5 and supplied with a battery voltage. The back-up power source 6 outputs a voltage of 12V to the back-up power source line 3 when being activated. Further, the back-up power source 6 performs a voltage compensation operation, after the engine is started and charging of a predetermined circuit of the back-up power source 6 is started. For example, the predetermined circuit may include a capacitor.

Next, an internal structure of the airbag ECU 1 will be described in detail.

In addition to the main power source line 2 and the back-up power source line 3, the airbag ECU 1 includes a main diode 10, a back-up diode 11, a CPU 12, a boosting circuit 13, an energy reserve capacitor 14, a 5V power source circuit 15, and a nonvolatile memory 16. As shown in FIG. 1, the main power source line 2 is coupled to the main diode 10, and the back-up power source line 3 is coupled to the back-up diode 11. The main power source line 2 and the back-up power source line 3 are individually coupled.

The CPU 12 normally measures a voltage Va at a point A defined at an anode of the main diode 10. Also, the CPU 12 normally measures a voltage Vb at a point B defined at an anode of the back-up diode 11.

A cathode of the main diode 10 and a cathode of the back-up diode 11 are coupled to each other to form a redundancy circuit 9. In this case, the redundancy circuit 9 outputs a logical sum of two inputs such as an input from the main power source line 2 and an input from the back-up power source line 3. The redundancy circuit 9 makes an output when receiving one of the two inputs or receiving the two inputs. It is to be noted that, since the redundancy circuit 9 includes the diodes 10, 11, a voltage at an input side of the redundancy circuit 9 and a voltage at an output side of the redundancy circuit 9 are not equal to each other.

The redundancy circuit 9 is provided at an input part of the airbag ECU 1. The airbag ECU 1 is operated as a voltage is applied to at least one of the main power source line 2 and the back-up power source line 3. The cathode of the main diode 10 and the cathode of the back-up diode 11 are coupled to each other. The cathode of the main diode 10 and the cathode of the back-up diode 11 have a voltage Vc in common at a point C. The CPU 12 normally measures the voltage Vc of the point C.

The cathode of the main diode 10 and the cathode of the back-up diode 11 are Coupled to the boosting circuit 13 through a line. The boosting circuit 13 increases the voltage outputted from the diodes 10, 11 to a constant voltage so as to compensate a voltage drop at the diodes 10, 11 in the redundancy circuit 9, and stably supplies the voltage increased to circuits that provide various functions.

The energy reserve capacitor 14 is coupled to an output side of the boosting circuit 13. The energy reserve capacitor 14 enables a part of or some of the circuits to operate for a predetermined period of time even after a power supply to the airbag ECU 1 is shut off.

The 5V power supply circuit 15 controls the voltage outputted from the boosting circuit 13 to 5V, and supplies the voltage of 5V to the CPU 12. The nonvolatile memory 16 stores information of the CPU 12.

For example, in a case where the air bag ECU 1 is employed in a vehicle having an ordinary ignition key, the main power source line 2 is in an on state when the ignition key is at "ON" position or "START" position. Also, the main power source line 2 is in an off state when the ignition key is at "ACC (accessory mode)" position, "OFF" position or "LOCK" position.

An operation of the airbag ECU 1 will be described with reference to FIGS. 1 and 2.

When the ignition switch 5 is closed in accordance with the key operation (t1 in FIG. 2), the main power source line 2 is turned on, that is, supplied with the electric power from the battery 4. Thus, the battery voltage is supplied to the point A through the main power source line 2. The voltage Va at the point A is the same as the voltage of the main power source line 2.

Further, when an operation to start the engine is performed by the manual operation such as the key operation (t3 in FIG. 2), the voltage Va rapidly drops as the starter motor requires a large amount of electric power to crank the engine. When an alternator begins to generate electric power after the engine is started, the voltage Va increases to a level higher than a level immediately after the main power source line 2 is turned on.

When the engine is stopped by the idling stop system (t4 in FIG. 2), power generation by the alternator is stopped. Therefore, the voltage Va decreases to a level similar to the level immediately after the main power source line 2 is turned on.

When the engine is restarted by the idling stop system (t6 in FIG. 2), the voltage Va rapidly drops again, similar to the drop when the engine is started by the key operation.

When the main power source line 2 is turned off by the key operation (t8 in FIG. 2), that is, the electric power supply from the battery 4 to the main power source line 2 is stopped, the voltage Va drops to a ground level.

Next, a change in the voltage Vb at the point B, which is defined at the anode of the back-up diode 11, will be described. The voltage Vb is the same as the voltage of the back-up power source line 3.

The voltage Vb is outputted from the back-up power source 6 (t2 in FIG. 2) when a predetermined period of time has elapsed after the ignition switch 5 is turned on by the key operation. That is, the voltage Vb is outputted in a delayed manner so as to avoid damage of the back-up power source 6 due to a rush current flowing into the back-up power source 6.

When the operation to start the engine is performed by the key operation (t3), the voltage Vb rapidly drops due to the power consumption of the starter motor at the time of cracking, similar to the voltage Va. At this point, charging of the circuit in the back-up power source 6 has not been started, and hence the voltage compensation operation VCO (back-up operation) has not been started.

After the engine is started and the power generation by the alternator is started, the charging of the circuit in the back-up circuit 6 is started according to a condition(s) such as an engine rotation speed and/or a voltage increase by the power generation of the alternator. In this case, the circuit of the back-up power source 6 is charged using the electric power from the battery 4 as the power source.

When the engine is stopped by the idling stop system (t4), the voltage Vb begins to decrease, similar to the voltage Va. Further, the voltage compensation operation VCO is begun (t5 in FIG. 2) according to a condition(s) such as a period of time from the engine stop, the voltage, and/or engine rotational speed (stop).

The back-up power source 6 monitors the voltage of the main power source line 2. When the voltage of the main power source line 2 decreases lower than a predetermined voltage Vp during a period of the voltage compensation operation VCO, the back-up power source 6 operates to maintain the voltage of the back-up power source line 3 to the predetermined voltage Vp. Therefore, as shown in FIG. 2, the voltage Vb at the point B is not largely dropped as the voltage Va when the engine is restarted by the idling stop system (t6).

The voltage compensation operation. VCO is finished (t7 in FIG. 2) according to a condition(s) such as the engine rotational speed and/or the voltage increase by the power generation of the alternator.

When the main power source line 2 is turned off by the key operation (t5), the voltage Vb drops to the ground level while being delayed from the drop of the voltage Va.

Next, a change in voltage Vc at the point C, which is defined at the cathode side of the main diode 10 and the back-up diode 11, will be described. The voltage Vc changes in a similar manner to the voltage Va, except for the timing (t6) where the engine is restarted by the idling sop system and the timing (t8) where the main power source line 3 is turned off by the key operation.

When the engine is restarted by the idling stop system (t6), the voltage Vc does not rapidly drop as the voltage Vb generated by the voltage compensation operation of the back-up power source 6 acts on the voltage Vc.

When the main power source line 2 is turned off by the key operation (t8), the voltage Vc changes in the similar manner to the voltage Vb.

It is to be noted that the diode has a resistance in a forward direction. Therefore, the voltage Vc at the point C is lower than the voltage Va at the point A and the voltage. Vb at the point B by the amount of voltage drop due to the diode.

As described above, when the engine is restarted by the idling stop system (t6), the voltage Vc does not largely and rapidly drop as the voltage Va. Therefore, the electric power can be stably supplied to the circuits in the airbag ECU 1. Accordingly, the following advantageous effects can be achieved.

The operation to start the engine by the manual operation of the key or the like is generally performed where the vehicle is parked. That is, it is considered that the manual operation to start the engine is performed at a relatively safe space. On the other hand, the idling stop operation is generally performed where the vehicle is on a traffic lane. Therefore, there is a possibility that the vehicle is bumped by another vehicle immediately after the engine is restarted. In the present embodiment, the electric power is stably supplied to the circuits within the airbag ECU 1. Therefore, the airbags are properly activated even in such a situation.

Next, a case where the back-up diode 11 has an open fault will be described.

When the back-up diode 11 has the open fault, the voltage for the back-up is not supplied from the cathode of the back-up diode 11, and the voltage compensation operation by the back-up power source 6 does not act on the point C. In this case, the voltage Vc changes at the timings t6 and t8 in the similar manner to the voltage Va, as shown by dashed lines C1, C2. As such, the change of the voltage Vc is proportional to and similar to the change of the voltage Va as a whole.

In the present embodiment, even if the back-up diode 11 has the open fault, the electric power is supplied to the airbag ECU 1 by the main power source line 2. Therefore, the airbag ECU 1 is operated normally. In this case, it is preferable to detect the open fault of the back-up diode 11 in order to further properly operate the airbag ECU 1.

Figure 3:
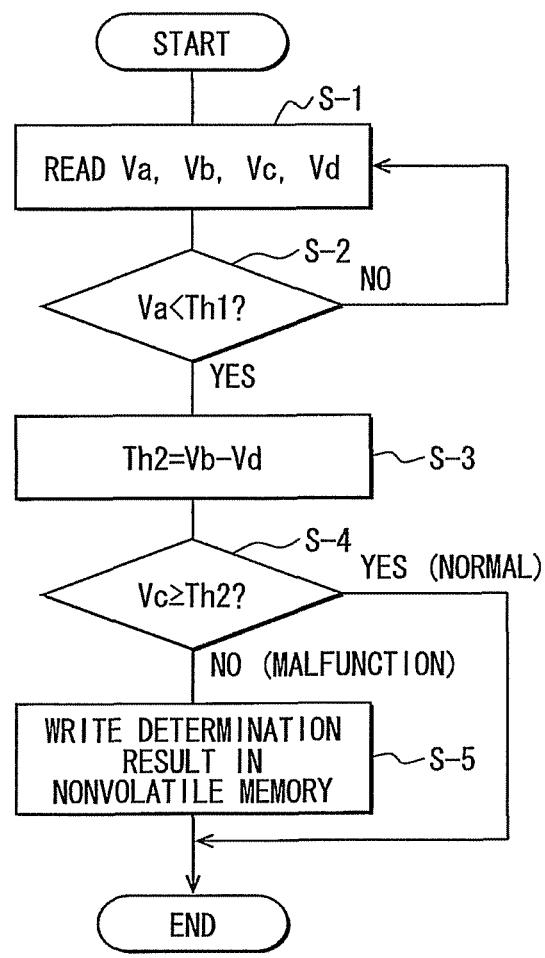
FIG. 3 is a flow chart illustrating an open fault determination process performed by the airbag electronic control unit, when a main power source line is turned off, according to the embodiment.

Next, a process of determining the open fault of the back-up diode 11 (hereinafter referred to as the open fault determination process) will be described with reference to a flow chart shown in FIG. 3. The open fault determination process is performed by the CPU 12.

At S-1, the CPU 12 reads the voltage Va at the point A, the voltage Vb at the point B, the voltage Vc at the point Vc and a constant Vd. At S-2, the CPU 12 compares the voltage Va to a first threshold Th1. The first threshold Th1 is used to determine whether the main power source line 2 is in the off state.

When the voltage Va is equal to or higher than the first threshold Th1, corresponding to "No" at the S-2, the CPU 12 determines that the main power source line 2 is in the on state and returns to the S-1. When the voltage Va is lower than the first threshold Th1, corresponding to "Yes" at the S-2, the CPU 12 determines that the main power source line 2 is in the off state. At S-3, the CPU 12 calculates a second threshold Th2 by subtracting the constant Vd from the voltage Vb (i.e., Th2=(Vb−Vd)).

The second threshold Th2 is calculated to perform comparison to the voltage Vc at a next step. The constant Vd is a value corresponding to the voltage drop in the forward direction of the back-up diode 11. Considering unevenness of elements, the constant Vd is set to a maximum value in specifications. Further, it may be possible to add a margin to the voltage Vd so as to reduce erroneous detection. In this case, the second threshold Th2 is set to a slightly lower value. The voltage Vb varies in accordance with various conditions such as the battery 4. Therefore, the second threshold Th2 is set as a variable value by using a latest measured value read at the S-1 as the voltage Vb.

At S-4, the CPU 12 compares the voltage Vc to the second threshold Th2. In a case where the back-up diode 11 has the open fault, the voltage Vc is lower than the second threshold Th2 as shown by the dashed line C2 in FIG. 2. Therefore, the CPU 12 determines that there is a malfunction, corresponding to "No" at the S-4, and proceeds to S-5. In a case where the back-up diode 11 does not have the open fault, the voltage Vc is equal to or higher than the second threshold Th2. Therefore, the CPU 12 determines that there is no malfunction, corresponding to "Yes" at the S-4, and ends the open fault determination process.

When the CPU 12 determines that there is a malfunction at the S-4, the CPU 12 writes a malfunction determination flag as a determination result in the nonvolatile memory at S-5, and ends the open fault determination process.

In this case, it has been determined that the main power source line 2 is in the off state by the key operation at the S-2. For example, it is assumed a situation where a passenger has arrived at a destination and is leaving the vehicle. If the malfunction is warned to the passenger in such a situation, it may be troublesome. Therefore, the malfunction is warned to the passenger next time the main power source line 2 is turned on by the key operation. The malfunction is warned to the passenger in accordance with a readout process that will be described hereinafter with reference to FIG. 4.

Figure 2:
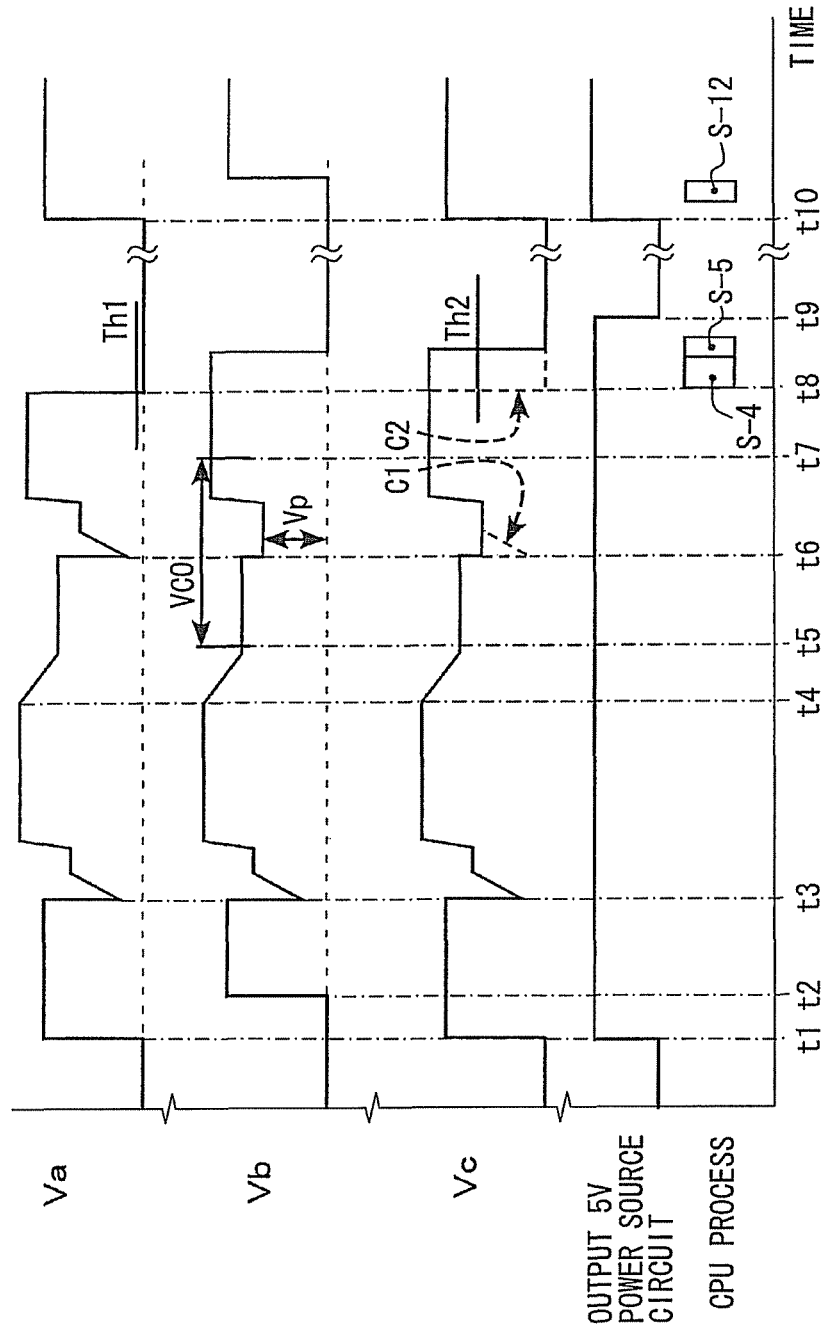
FIG. 2 is a time chart illustrating a process performed by the airbag electronic control unit according to the embodiment.

The open fault determination process described above is enabled as the output of the 5V power source circuit 15 is continued to a timing (t9) after the drop of the voltage Vb and the voltage Vc by the function of the energy reserve capacitor 14, as shown by a waveform of the 5V power source circuit 15 and the process of the CPU 12 in FIG. 2.

Figure 4:
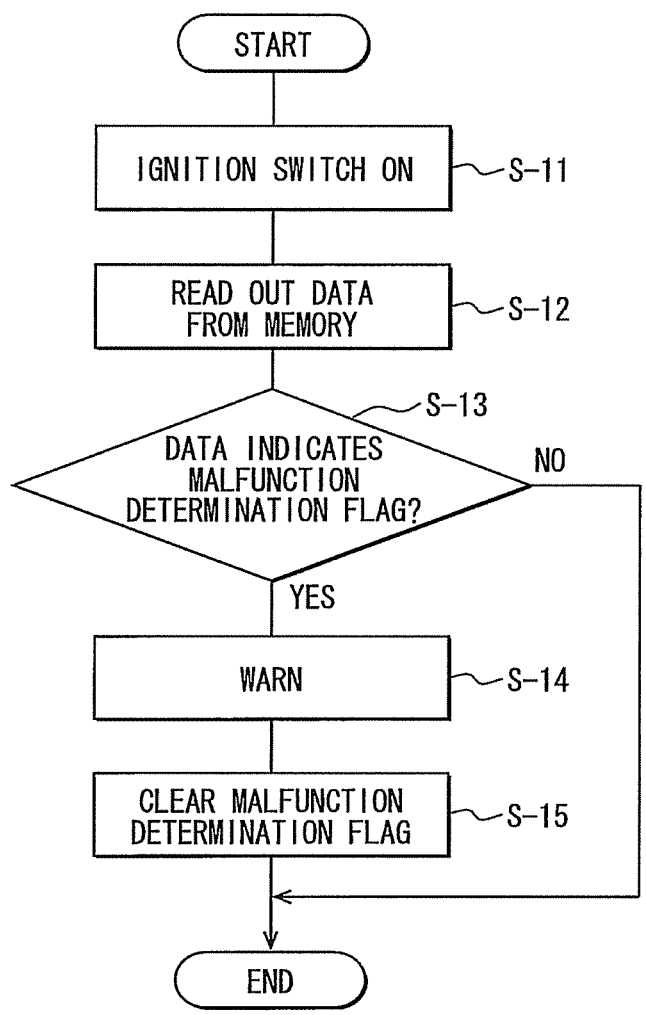
FIG. 4 is a flow chart illustrating a readout process performed by the airbag electronic control unit, when the main power source line is turned on, according to the embodiment.

Next, the readout process performed by the CPU 12 will be described with reference to the flow chart of FIG. 4.

At S-11, when the ignition switch 5 is turned on (e.g., t10 in FIG. 2), the voltage of 5V is outputted from the 5V power source circuit 15 via a predetermined route. At S-12, the CPU 12 reads out data from the nonvolatile memory 16. At S-13, the CPU 12 determines whether the data read from the nonvolatile memory 16 indicates the malfunction determination flag or not.

When the data does not indicate the malfunction determination flag, corresponding to "No" at the S-13, the CPU 12 ends the readout process. When the data indicates the malfunction determination flag, corresponding to "Yes" at the S-13, the CPU 12 proceeds to S-14.

At the S-14, the CPU 12 performs a process to warn the passenger of the malfunction by means of an airbag warning indicator. At S-15, the CPU 12 cancels the malfunction determination flag in the nonvolatile memory 16, and ends the readout process.

In the present embodiment described above, the airbag ECU 1 includes the redundancy circuit 9 to which the main power source line 2 and the back-up power source line 3 are individually coupled. The back-up power source line 3 performs the voltage compensation operation when the voltage of the main power source line 2 is lower than a predetermined level. The redundancy circuit 9 includes the diodes 10, 11 at the input part to which the main power source line 2 and the back-up power source line 3 are coupled. The back-up power source line 3 is turned on after the main power source line 2 is turned on. The back-up power source line 3 is turned off after the main power source line 2 is turned off.

The CPU 12 compares the voltage Vb of the anode of the back-up diode 11 to the voltage Vc of the cathode of the back-up diode 11 in a period from the time the main power, source line 2 is turned off to the time the back-up power source line 3 is turned off after the main power source line 2 is turned off, and detects the open fault of the back-up diode 11 based on a comparison result. Thus, the CPU 12 serves as a fault detector.

The present disclosure is not limited to the exemplary embodiment described above. Also, the following modifications will be made in the exemplary embodiment described above.

For example, the back-up power source 6 may be provided by a specific battery. In such a case, a charging rate or a charging amount of the specific battery is monitored. When the charging rate or the charging amount is lower than a predetermined level, the specific battery may be charged by the alternator on condition that a brake operation is performed by a driver, such as a brake lamp is lit, in preparation for the restarting after the idling stop. Such a specific battery may be less expensive than the back-up power source 6 depending on the size thereof. Also, it may not be necessary to increase the capacity of the battery of the main power source.

In the exemplary embodiment described above, the ECU 1 is exemplarily employed to the airbag ECU. However, the ECU 1 is not limited to the airbag ECU. The ECU 1 may be employed to a control unit for a safety device that should be securely activated when the engine is restarted from the idling stop or to a control unit of an electric device used for any other purpose.

In the exemplary embodiment described above, the open fault of the back-up diode 11 is warned to the passenger or user by the warning indicator. Further, information on the open fault of the back-up diode 11 of the airbag ECU 1 may be effectively used in an ECU of another device.

Summarizing the above, in an embodiment, a control unit for a vehicle includes a redundancy circuit 9 and a fault detector 12. The redundancy circuit 9 includes a main power source line 2, a back-up power source line 3, and a diode 11. The main power source line 2 is supplied with electric power from a battery 4. The back-up power source line 3 performs a voltage compensation operation when a voltage of the main power source line 2 is lower than a predetermined voltage. The back-up power source line 3 is turned on when a predetermined period of time has elapsed after the main power source line 2 is turned on. The back-up power source line 3 is turned off when a predetermined period of time has elapsed after the main power source line 2 is turned off. The diode 11 is disposed on the back-up power source line 3. The fault detector 12 monitors a voltage of a cathode of the diode 11, and detects an open fault of the diode 11 when the voltage of the cathode of the diode 11 is lower than a predetermined threshold within the predetermined period of time after the main power source line 2 is turned off.

In the above structure, when the electric power supply to the main power source line 2 is stopped, in a normal condition, the voltage of the cathode of the diode 11 is maintained by means of the voltage compensation operation of the back-up power source line 3. However, if the diode 11 has an open fault, the voltage of the cathode of the diode 11 largely drops. Therefore, the open fault of the diode 11 can be detected based on the voltage of the cathode of the diode 11.

The predetermined threshold may be equal to or lower than a value that is obtained by subtracting the voltage drop of the diode 11 in a forward direction from a voltage of an anode of the diode 11. In this case, if the diode 11 is in a normal condition, the voltage of the cathode of the diode 11 corresponds to a value that is obtained by subtracting the voltage drop due to a resistance of the diode 11 in the forward direction from the voltage of the anode of the diode 11. If the diode 11 has an open fault, the voltage of the cathode of the diode 11 largely drops. Therefore, the open fault of the diode 11 is properly detected by setting the predetermined threshold to a level equal to or lower than the voltage level expected in the normal condition.

The fault detector 12 may store a detection result in a nonvolatile memory 16 when the open fault of the diode 11 is detected, and read the detection result from the nonvolatile memory 16 next time the main power source line 2 is turned on.

The back-up power source line 3 may be supplied with the electric power from the battery 4. In this case, a sub battery as a power source of the back-up power source line 3 is hot necessary. Therefore, a manufacturing cost reduces. Alternatively, the back-Up power source line 3 may be supplied with electric power from a power source that is different from the battery 4. In this case, it is not necessary to increase the battery 4 for the main power source line 2. Also, the back-up power source line 3 will not be affected by the decrease in the voltage of the battery 4 for the main power source line 2.

While only the selected exemplary embodiment has been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment according to the present disclosure is provided for illustration only, and not for the purpose of limiting the disclosure as defined by the appended claims and their equivalents.

What is claimed is:
1. A control unit for a vehicle, comprising:
   a redundancy circuit including:
      a main power source line being supplied with electric power from a battery of the vehicle;

a back-up power source line performing a voltage compensation operation when a voltage of the main power source line is lower than a predetermined voltage, the back-up power source line being turned on when a predetermined period of time has elapsed after the main power source line is turned on, and the back-up power source line being turned off when a predetermined period of time has elapsed after the main power source line is turned off; and a diode being disposed on the back-up power source line; and a fault detector monitoring a voltage of an anode of the diode and a voltage of a cathode of the diode; and an energy reserve capacitor supplying electric power to the fault detector until the predetermined period of time elapses after the main power source line is turned off, wherein:

the fault detector detects an open fault of the diode when the voltage of the cathode of the diode is lower than a predetermined threshold within the predetermined period of time after the main power source line is turned off, and the predetermined threshold is less than or equal to a value that is obtained by subtracting a voltage drop of the diode in a forward direction from the voltage of the anode of the diode, and is larger than the voltage drop of the diode in the forward direction.

2. The control unit according to claim 1, wherein
the fault detector stores a detection result in a nonvolatile memory when the open fault of the diode is detected, and reads out the detection result from the nonvolatile memory next time the main power source line is turned on.

3. The control unit according to claim 1, wherein
the back-up power source line is supplied with the electric power from the battery.

4. The control unit according to claim 1, wherein
the back-up power source line is supplied with electric power from a power source different from the battery.

* * * * *